(12) United States Patent
Hilkene et al.

(10) Patent No.: US 10,500,614 B2
(45) Date of Patent: Dec. 10, 2019

(54) TEMPERATURE CONTROLLED REMOTE PLASMA CLEAN FOR EXHAUST DEPOSIT REMOVAL

(71) Applicant: Applied Materials, Inc., Santa Clara, CA (US)

(72) Inventors: Martin A. Hilkene, Gilroy, CA (US); David K. Carlson, San Jose, CA (US); Matthew D. Scotney-Castle, Morgan Hill, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 205 days.

(21) Appl. No.: 15/479,609

(22) Filed: Apr. 5, 2017

(65) Prior Publication Data

US 2017/0304877 A1    Oct. 26, 2017

Related U.S. Application Data

(60) Provisional application No. 62/327,870, filed on Apr. 26, 2016.

(51) Int. Cl.
| | | |
|---|---|---|
| *B08B 5/00* | (2006.01) | |
| *B08B 7/00* | (2006.01) | |
| *H01J 37/32* | (2006.01) | |
| *C30B 25/14* | (2006.01) | |
| *C30B 29/06* | (2006.01) | |

(52) U.S. Cl.
CPC ............ *B08B 7/0035* (2013.01); *C30B 25/14* (2013.01); *C30B 29/06* (2013.01); *H01J 37/32357* (2013.01); *H01J 2237/335* (2013.01)

(58) Field of Classification Search
None
See application file for complete search history.

(56) References Cited

U.S. PATENT DOCUMENTS

| | | | |
|---|---|---|---|
| 6,872,365 | B1 | 3/2005 | Boegner et al. |
| 2006/0107973 | A1 | 5/2006 | Leung |
| 2006/0266288 | A1 | 11/2006 | Choi |
| 2007/0286766 | A1 | 12/2007 | Choi |
| 2008/0251104 | A1* | 10/2008 | Chen ................... C23C 16/4405 134/18 |

FOREIGN PATENT DOCUMENTS

| | | |
|---|---|---|
| EP | 1139386 A2 | 10/2001 |
| TW | 200802589 A | 1/2008 |

OTHER PUBLICATIONS

Taiwan Office Action dated Mar. 19, 2019 for Application No. 106113035.
International Search Report and Written Opinion dated Jul. 18, 2017 for Application No. PCT/US2017/025999.

* cited by examiner

*Primary Examiner* — Mikhail Kornakov
*Assistant Examiner* — Ryan L. Coleman
(74) *Attorney, Agent, or Firm* — Patterson + Sheridan LLP

(57) ABSTRACT

Embodiments of the present disclosure generally relate to a methods and apparatuses for cleaning exhaust systems, such as exhaust systems used with process chambers for the formation of epitaxial silicon. The exhaust system includes a remote plasma source for supplying ionized gas through the exhaust system, and one or more temperature sensors positioned downstream of the remote plasma source.

9 Claims, 3 Drawing Sheets

TEMPERATURE CONTROLLED REMOTE PLASMA CLEAN FOR EXHAUST DEPOSIT REMOVAL

CROSS-REFERENCE TO RELATED APPLICATIONS

This application claims benefit of U.S. Provisional Patent Application Ser. No. 62/327,870, filed Apr. 26, 2016, which is herein incorporated by reference.

BACKGROUND

Field

Aspects of the present disclosure generally relate to a methods and apparatuses for cleaning exhaust systems, such as exhaust systems used with process chambers for the formation of epitaxial silicon.

Description of the Related Art

Epitaxial silicon is deposited in process chambers using silicon-containing precursor gases. After a predetermined number of deposition cycles in the process chamber, the process chamber is cleaned using a chlorine-containing gas. Chloride radicals from the chlorine-containing gas react with silicon to form chlorosilane, which is exhausted from the process chamber. The chlorosilane is a flammable material which deposits on internal surfaces of the exhaust system, and must be periodically removed. Cleaning times to remove the chlorosilane can range from half a day to up to a month, depending on the extent of removal required. Additionally, the chlorosilane may react with oxygen in the ambient environment upon disassembly of the exhaust system, thus forming chlorosiloxane, which is a contact explosive. The formation of chlorosiloxane further extends the time required for cleaning and maintenance due to the extra precautions which are taken by personnel.

Therefore, an improved method and apparatus for cleaning exhaust systems is needed.

SUMMARY

In one aspect, a processing system comprises a process chamber; and an exhaust system coupled to the process chamber. The exhaust system comprises a remote plasma source for supplying an ionized cleaning gas to the exhaust system downstream of the process chamber; and one or more sensors for measuring the temperature of the exhaust system at one or more locations of the exhaust system.

In another aspect, a processing system comprises a process chamber and an exhaust system coupled to the process chamber. The exhaust system comprises a remote plasma source for supplying an ionized cleaning gas to the exhaust system downstream of the process chamber; one or more sensors downstream of the remote plasma source for measuring the temperature of the exhaust system at one or more locations of the exhaust system; an endpoint detection system downstream of the one or more sensors; and a vacuum pump downstream of the endpoint detection system.

In another embodiment, a process for cleaning an exhaust system comprises introducing one or more ionized gases to the exhaust system downstream of a process chamber; monitoring the temperature within the exhaust system; and adjusting the flow rate of the one or more ionized gases based on the monitored temperature.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of its scope, and the disclosure may admit to other equally effective aspects.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

Aspects of the present disclosure generally relate to a methods and apparatuses for cleaning exhaust systems, such as exhaust systems used with process chambers for the formation of epitaxial silicon. The exhaust system includes a remote plasma source for supplying ionized gas through the exhaust system, and one or more temperature sensors positioned downstream of the remote plasma source. It is to be noted that the use of methods and apparatuses described herein are contemplated for other processes, such as etching, or the deposition of materials other than epitaxial silicon.

Figure 1:
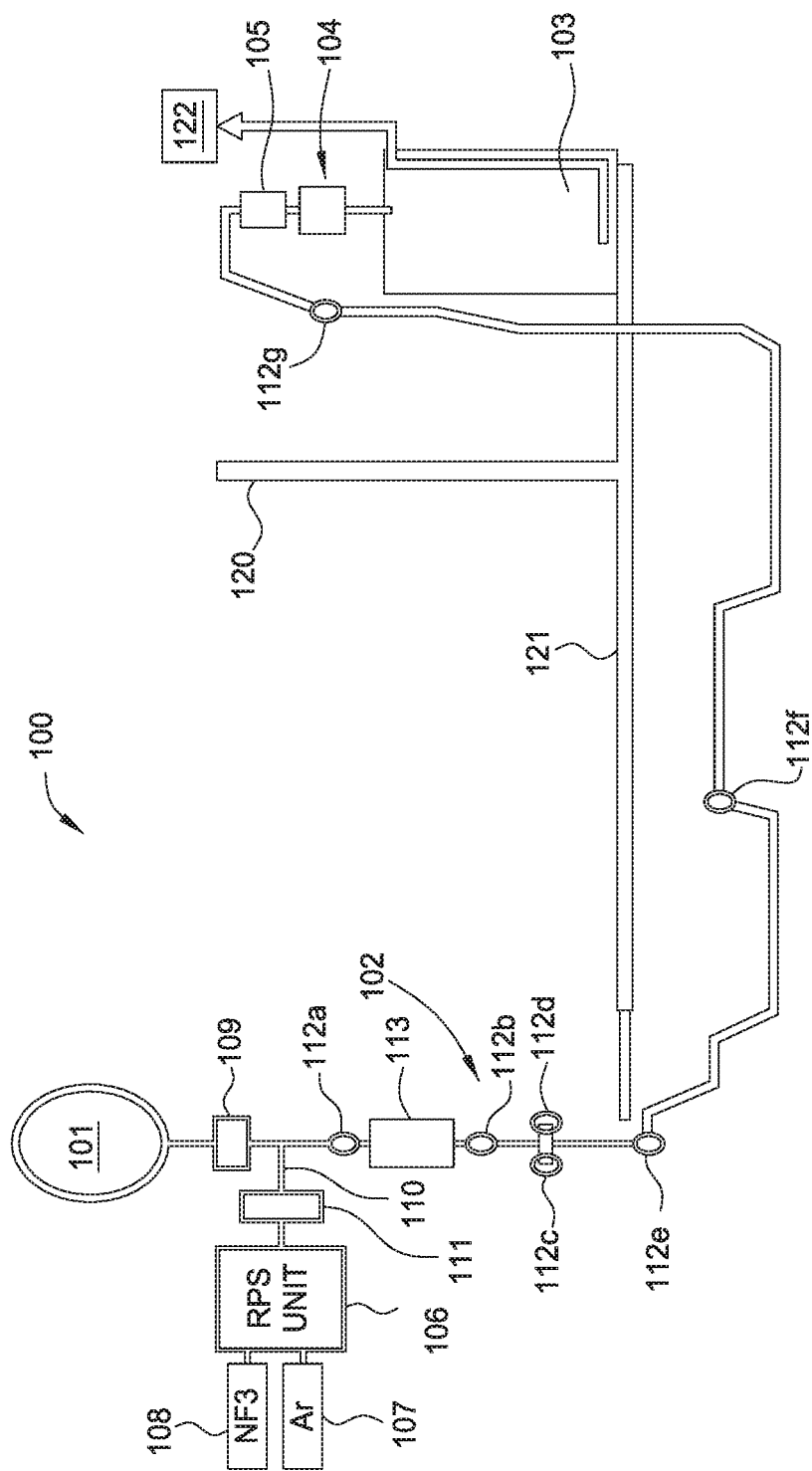
FIG. 1 is a schematic illustration of a processing system 100, according to one aspect of the disclosure.

FIG. 1 is a schematic illustration of a processing system 100, according to one aspect of the disclosure. The processing system 100 includes a process chamber 101, such as an epitaxial deposition reactor, coupled to an exhaust system 102. The exhaust system 102 is coupled to a vacuum pump 103 at a downstream end thereof to facilitate flow of effluent to a scrubber 122 located downstream of the exhaust system 102. The exhaust system 102 may include an endpoint detection system 104 coupled thereto via bellows 105. The exhaust system 102 and the bellows 105 may be disposed upstream of the vacuum pump 103 to facilitate determination of the endpoint of a cleaning operation.

A remote plasma source (RPS) 106 is coupled to the exhaust system 102 to ionize cleaning, purge, carrier, or other process gases, and to provide the ionized gases to the exhaust system 102. For example, a first gas supply source 107 may be coupled to the RPS 106 to provide an inert or non-reactive gas, such as argon, therethrough to the exhaust system 102. Additionally, a second gas supply source 108 may be coupled to the RPS 106 to provide a cleaning gas, such as $NF_3$, therethrough to the exhaust system 102. Other contemplated cleaning gases include $NF_2H$, $CHF_3$, $CF_4$, and the like. It is to be noted that other cleaning gases and other non-reactive gases are contemplated. The ionized gases facilitate removal of accumulated deposits from the interior of the exhaust system 102, thus reducing or eliminating the need for disassembly of the exhaust system 102 for cleaning.

The exhaust system 102 includes a first isolation valve 109 which prevents the backflow of exhaust gases into the process chamber 101. The process chamber 101 may be separated from the vacuum pump 103 by a wall 120. The RPS 106 is coupled to the exhaust system 102 downstream of the first isolation valve 109 via a gas passage 110. The gas passage 110 includes a second isolation valve 111 disposed therein for controlling gas flow therethrough, and thus, for controlling gas flow from the RPS 106 to the exhaust system 102. The isolation valves 109, 111 may be controlled by a controller (not shown).

The exhaust system 102 also includes one or more sensors 112a-112g (seven are shown) for sensing temperature. A first temperature sensor 112a is disposed downstream of the isolation valves 109, 111 and upstream of a pressure control valve 113. The remaining sensors 112b-112g are positioned downstream of the pressure control valve 113 and upstream of the bellows 105. The sensors 112a-112g facilitate monitoring of the exhaust temperature at different locations of the exhaust system 102. In one aspect, the sensors 112a-112g are positioned at locations in the exhaust system 102 susceptible to increased deposition of effluent material. For example, valves, elbows, T-fittings, and the like are susceptible to increase deposition of material. In one example, the sensors 112a-112g may be thermocouples. In one example, temperature sensors 112e and 112f are located below a floor 121.

The temperature sensors 112a-112g facilitate monitoring of a cleaning operation within the exhaust system 102. The reaction of fluoride radicals from a cleaning gas with chlorosilane deposits is exothermic. Thus, the extent of reaction can be generally qualified through temperature measurements. For example, endpoint detection of the cleaning operation may be monitored by tracking the temperature within the exhaust system 102. An elevated temperature at the sensor 112a-112g indicates reaction of cleaning gas with deposited material, while a temperature approximately equal to or approaching ambient temperature (or the temperature of the cleaning gas exiting the RPS 106) indicates a substantially completed cleaning operation due to complete reaction/removal of deposited material.

Additionally or alternatively, the sensors 112a-112g may be utilized to facilitate monitoring and control of the cleaning operation. For example, the sensors 112a-112g may monitor temperature in order to prevent runaway exothermic reactions within the exhaust system. As a measured temperature at a particular sensor 112a-112g approaches a predetermined limit, a signal may be relayed to a controller. In turn, the controller may adjust the flow rate (and/or stop the flow rate) of cleaning gas exiting the RPS 106. A decrease in the amount of cleaning gas limits the extent of reaction in the exhaust system 102, thus maintaining temperatures at desirable levels.

It is contemplated that each sensor 112a-112g may be programmed to the same or different temperatures limits. For example, the pressure control valve 113 may be temperature-sensitive, and thus, sensors 112a and 112b adjacent the pressure control valve 113 may be limited to a relatively lower temperature, such as about 70 degrees Celsius to about 80 degrees Celsius. Sensors 112c-112g may be positioned adjacent components such as T-fitting or elbows, which are less temperature sensitive. In such as example, the feedback signal for sensors 112c-112g may be set at a relatively higher temperature, such as about 110 degrees Celsius to about 130 degrees Celsius.

It is also contemplated that the controller may respond based on the readings of more than one of the temperature sensors 112a-112g. For example, if only one of the temperature sensors 112a-112g records a high temperature, the controller may be configured not to respond until one or more additional temperature sensors 112a-112g records a high temperature.

In another example, each sensor 112a-112g may include two-tiered limits. For example, when a first limit is reached, a signal may be relayed to reduce the flow of a cleaning gas. When a second, higher, limit is reached, a flow of the cleaning gas may be completely halted to quench any reactions in the exhaust system 102. It is contemplated that the sensors 112a-112g may be coupled to any suitable relay or communication link to facilitate transfer of information or control of gas flow. In one example, snap switches and/or interlock switches may be utilized to control gas flow within the exhaust system 102. The snap switches and/or interlock switches may be positioned adjacent to or coupled to a respective sensor 112a-112g.

In another example, the controller may be configured to respond when a rate of temperature rise in one or more of the sensors 112a-112g is above a limit. The controller may sample temperature readings from the sensors 112a-112g according to a set interval, compare successive readings of the sensors 112a-112g to determine a temperature change, and compare the temperature change to a limit, which may be the same for all sensors 112a-112g or different for any or all of the sensors 112a-112g. The controller may then adjust flow of cleaning gas if any or all temperature changes are above their respective limits.

A cleaning operation may be performed in the exhaust system after a predetermined interval, such as processing a specific number of substrates in the process chamber 101. In a cleaning process, the isolation valve 109 is closed to prevent backflow of cleaning gas into the process chamber. The pressure within the process chamber 101 may be monitored to ensure that the isolation valve is not leaking and thus not undesirably allow cleaning gas to enter the process chamber. Subsequently, the second isolation valve 111 is opened to allow gas ionized by the RPS 106 to travel through the exhaust system 102, and additionally, the pressure control valve 113 is set to a position that gives a pressure suitable for striking a plasma, for example, about 0.5 torr to about 1.5 torr. Argon is then allowed to flow through the RPS 106 at a flow rate within a range of about 500 standard cubic centimeters per minute (sccm) to about 3000 sccm. A plasma is then ignited in the RPS 106 and allowed to stabilize, for example, for about 5 seconds to about 10 seconds.

Once the plasma has stabilized, a cleaning gas such as $NF_3$ is provided to the RPS 106 at flow rate within a range of 100 sccm to about 500 sccm, and is allowed to flow through the exhaust system 102 to remove accumulated material from within the exhaust system 102. A control system coupled to one or more sensors 112a-112g monitors the exhaust component temperature. If the exhaust components reach a predetermined threshold, the flow of cleaning gas is reduced or halted to allow the exhaust system 102 to cool. Once the temperature cools to a predetermined set point, the cleaning gas flow is resumed or elevated. The process may be repeated until the exhaust system 102 is sufficiently cleaned. Continued monitoring of the temperature facilities identification of cleaning endpoint. As the temperature of the components approaches ambient temperature, cleaning endpoint is indicated. Alternatively, clean process endpoint detection may be determined using the endpoint detection system 104, which may be, for example, a nondispersive infrared sensor.

During a cleaning operation, temperature within the exhaust system may be controlled using a variable flow ratio of carrier gas to cleaning gas. For example, argon and $NF_3$ may be ionized in the RPS 106 using a flow ratio of about 2:1 to about 4:1 when initiating a cleaning operation. In a specific aspect, about 1 standard liter per minute (slm) of argon is provided to the RPS 106, while 250 sccm of $NF_3$ are provided to the RPS. As the cleaning operation continues, the flow rate of $NF_3$ may be increased until a 1:1 ratio of argon to $NF_3$ is reached, temperature permitting. The change in flow ratio allows a cleaning process to be expedited as safely allowed by process parameters.

In another alternative, the flow of $NF_3$ gas may be pulsed according to a desired duty cycle. It is contemplated that pulsing the $NF_3$ gas may slow down the rate of temperature increase within the exhaust system 102. As another alternative, rather than decreasing or halting flow of the cleaning gas when a temperature threshold is reached, it is contemplated that the plasma in the RPS 106 may be extinguished. In such an aspect, the flow of cleaning gas may be allowed to continue flowing since cleaning gas is less reactive when not ionized by the RPS 106. Alternatively, flow of $NF_3$ gas may also be halted when plasma is extinguished.

Figure 2:
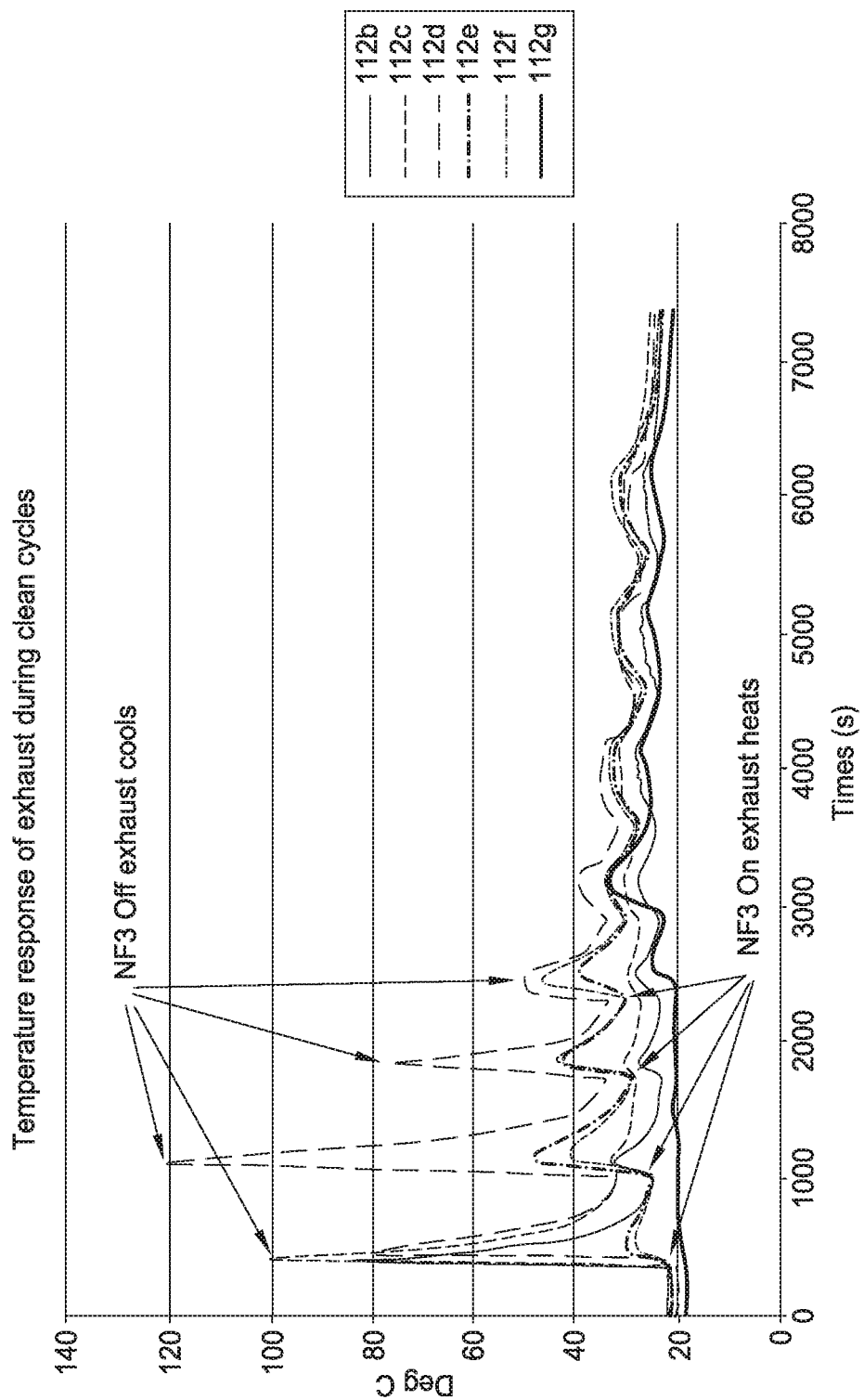
FIG. 2 is a graph illustrating temperature response of an exhaust system during cleaning cycles.

FIG. 2 is a graph illustrating temperature response of an exhaust system during cleaning cycles. The temperatures measured at each sensor 112b-112g (e.g., sensors downstream of the pressure control valve 113) are shown). The relative spikes in temperature indicate an increase in temperature due to an exothermic reaction as ionized cleaning gas reacts with deposited material, and a decrease in temperature as the flow of cleaning gas is reduced or halted in response to reaching a threshold temperature. Once the temperature is reduced to a predetermined set point, flow of the cleaning gas is resumed, as indicated by a subsequent increase in temperature. As shown in FIG. 2, a threshold temperature of about 100 degrees Celsius is reached at sensor 112c at about 500 seconds, triggering a reduction in cleaning gas flow rate. The flow rate of cleaning gas is resumed when the temperature at the sensor 112c approaches 30 degrees Celsius. Subsequently, a threshold temperature of about 120 degrees is reached at sensor 112d, triggering a reduction in cleaning gas flow at around at 1100 seconds. Similar peak events are illustrated around 1900 seconds 2500 seconds, 3200 seconds, 4000 seconds, 5000 seconds, and 6000 seconds.

As noted above, the cycling of cleaning gas flow is continued until the exhaust system is sufficiently cleaned. The continued reduction in peak amplitude indicates a reduction in deposited material within the exhaust system, e.g., a reduction in reactant (for example, chlorosilane). As illustrated, at about 7000 seconds, the temperature within the exhaust system of all sensors approaches ambient temperature, indicating process endpoint.

After the exhaust system 102 has been cleaned as described above, the exhaust system 102 may be purged to remove any cleaning gas or reacted by products from the exhaust system 102. In one example, the exhaust system 102 may be flushed using the carrier gas from the cleaning process, such as argon. In another aspect, the exhaust system 102 may be backfilled with nitrogen and flushed, while the isolation valves 109, 111 are in the closed position. The exhaust system 102 may be backfilled and flushed multiple times, such as about 5-10 times.

Figure 3:
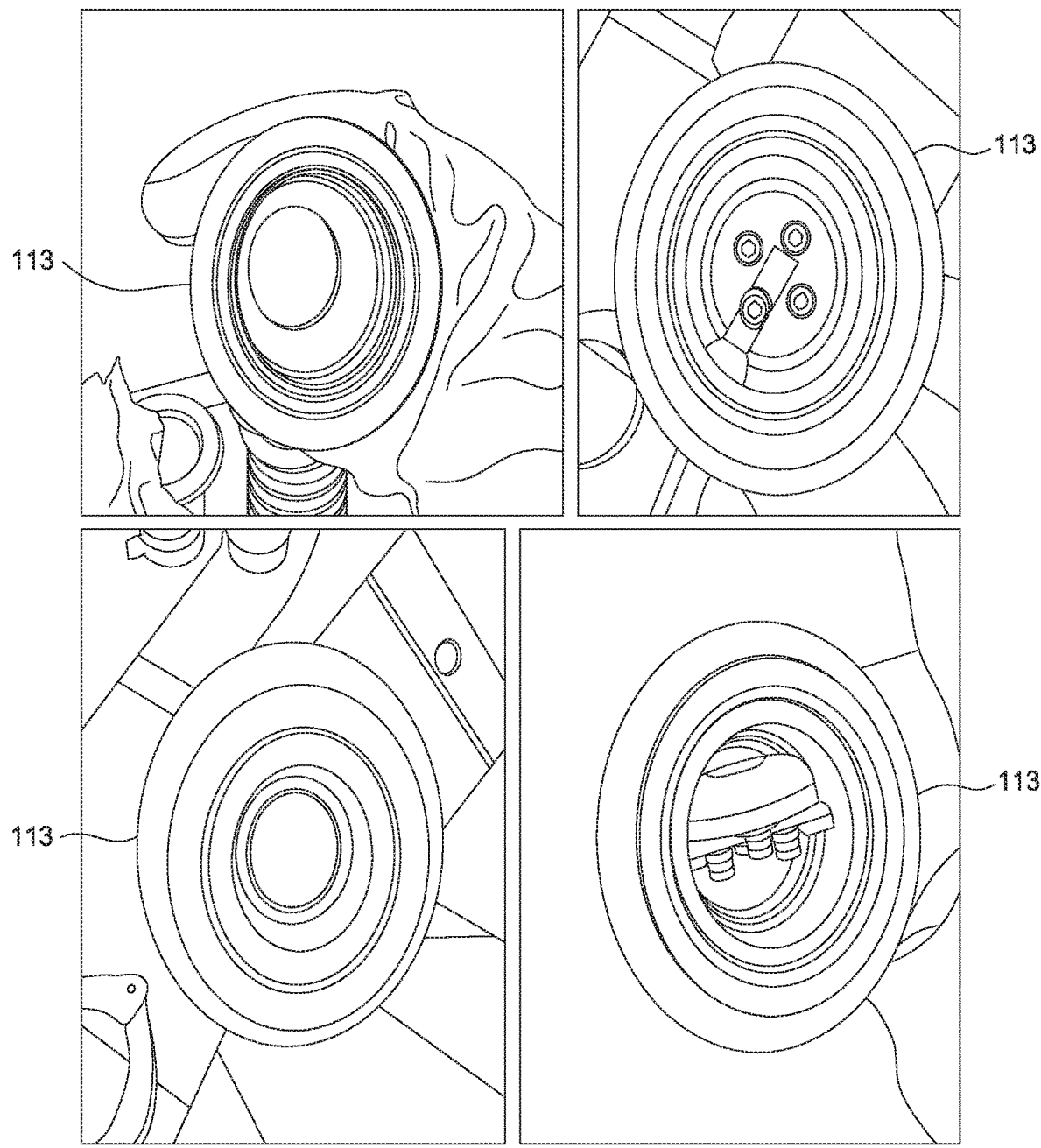
FIG. 3 illustrates internal views of sections of the exhaust system after cleaning according to aspects described herein.

FIG. 3 illustrates internal views of sections of the exhaust system after cleaning according to aspects described herein. In particular, FIG. 3 illustrates internal views of the pressure control valve 113. As illustrated, aspects described herein sufficiently cleaned the pressure control valve 113, as no deposits are shown. The cleaning occurred without thermal damage to the pressure control valve 113.

Benefits of aspects described herein include safer and faster cleaning of exhaust systems. Aspects described herein may reduce cleaning times from up to one month to as little as 100 minutes or less. Additionally, the duration between timely and costly preventative maintenances may be extended. Moreover, aspects described herein reduce or eliminate the need to disassemble an exhaust system, which would otherwise expose chlorosilane to ambient oxygen and form chlorosiloxane. Even when disassembly is required, exposed components have much less chlorosilane present thereon after being cleaned in accordance with aspects of this disclosure.

In one example, an exhaust system is cleaned in accordance with aspects described herein. Upon disassembly, hydrochloric acid (which is outgassed as chlorosilane reacts with ambient oxygen) is measured in the ambient environment at a concentration of 1.5 parts-per-million (ppm), which is lower than threshold value of 5 ppm. In contrast, a conventional exhaust system which is disassembled for cleaning would likely exceed an HCl concentration of 5 ppm when exposed to the ambient environment.

While the foregoing is directed to aspects of the present disclosure, other and further aspects of the disclosure may be devised without departing from the basic scope thereof, and the scope thereof is determined by the claims that follow.

What is claimed is:

1. A processing system, comprising:
   a process chamber in which substrates are processed; and
   an exhaust system coupled to the process chamber, the exhaust system comprising:
   a remote plasma source for supplying an ionized cleaning gas to the exhaust system downstream of the process chamber, wherein the remote plasma source comprises an input through which cleaning gas flows into the remote plasma source;
   a first isolation valve downstream of the process chamber;
   a second isolation valve downstream of the remote plasma source;
   a pressure control valve downstream of the first isolation valve and the second isolation valve;
   a first sensor configured to measure a temperature of the exhaust system downstream of the first isolation valve and the second isolation valve and upstream of the pressure control valve;
   a second sensor configured to measure a temperature of the exhaust system downstream of the pressure control valve; and
   a controller configured to receive temperature data from the first and second sensors and decrease a flow rate of ionized cleaning gas exiting the remote plasma source when a temperature in the exhaust system is determined by the controller to be above a predetermined limit.

2. The processing system of claim 1 further comprising an endpoint detection system located downstream of the second sensor.

3. The processing system of claim 2, further comprising a vacuum pump located downstream of the endpoint detection system.

4. The processing system of claim 1, wherein the second sensor is coupled to a tee fitting in the exhaust system.

5. The processing system of claim 1, wherein the controller is configured to control a flow rate of ionized cleaning gas exiting the remote plasma source such that:

flow of the ionized cleaning gas to the exhaust system is reduced when a measured temperature of the exhaust system is above a first temperature and below a second temperature; and flow of the ionized cleaning gas to the exhaust system is stopped when a measured temperature of the exhaust system is above the second temperature.

6. A processing system, comprising:

a process chamber in which substrates are processed; and an exhaust system coupled to the process chamber, the exhaust system comprising:

a remote plasma source for supplying an ionized cleaning gas to the exhaust system downstream of the process chamber, wherein the remote plasma source comprises an input through which cleaning gas flows into the remote plasma source;

a first isolation valve downstream of the process chamber;

a second isolation valve downstream of the remote plasma source;

a pressure control valve downstream of the first isolation valve and the second isolation valve;

a first sensor configured to measure a temperature of the exhaust system downstream of the first isolation valve and the second isolation valve and upstream of the pressure control valve;

a second sensor configured to measure a temperature of the exhaust system downstream of the pressure control valve;

a controller configured to receive temperature data from the first and second sensors and decrease a flow rate of ionized cleaning gas exiting the remote plasma source when a temperature in the exhaust system is determined by the controller to be above a predetermined limit;

an endpoint detection system downstream of the pressure control valve; and a vacuum pump downstream of the endpoint detection system.

7. The processing system of claim 6, wherein the second sensor is upstream of the endpoint detection system.

8. The processing system of claim 7, wherein the second sensor is coupled to a tee fitting in the exhaust system.

9. The processing system of claim 6, wherein the controller is configured to control a flow rate of ionized cleaning gas exiting the remote plasma source such that:

flow of the ionized cleaning gas to the exhaust system is reduced when a measured temperature of the exhaust system is above a first temperature and below a second temperature; and flow of the ionized cleaning gas to the exhaust system is stopped when a measured temperature of the exhaust system is above the second temperature.

* * * * *